Figure 1:
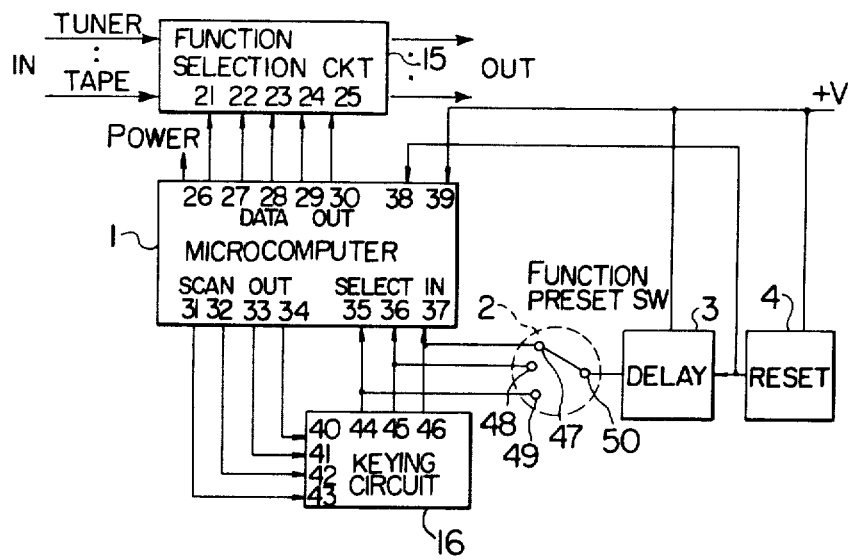

United States Patent [19]

Enoki et al.

[11] 4,424,574
[45] Jan. 3, 1984

[54] FUNCTION PRESETTING CIRCUIT FOR AN AUDIO/VIDEO RECORDING AND REPRODUCING SYSTEM

[75] Inventors: Takashi Enoki; Hiroaki Nakamura, both of Toyokawa; Fujio Nakashima, Aichi, all of Japan

[73] Assignee: Hitachi, Ltd., Tokyo, Japan

[21] Appl. No.: 247,264

[22] Filed: Mar. 25, 1981

[30] Foreign Application Priority Data

Mar. 26, 1980 [JP] Japan ............................... 55-37485

[51] Int. Cl.³ ............................................. G11B 27/36
[52] U.S. Cl. .......................................... 364/900; 369/2
[58] Field of Search ... 364/900 MS File, 200 MS File

[56] References Cited

U.S. PATENT DOCUMENTS

| 4,026,555 | 5/1977 | Kirschner et al. | 364/200 |
| 4,117,542 | 9/1978 | Klausner et al. | 364/900 |
| 4,118,792 | 10/1978 | Struger et al. | 364/900 |
| 4,213,189 | 7/1980 | Mueller et al. | 364/900 |

*Primary Examiner*—Felix D. Gruber
*Assistant Examiner*—D. Rutherford
*Attorney, Agent, or Firm*—Antonelli, Terry & Wands

[57] ABSTRACT

A function presetting circuit for an audio/video stereophonic playback system for presetting a function and controlling operations by a microcomputer comprises a reset circuit for providing a reset signal to the microcomputer at a time of power-on, a delay circuit for receiving the reset signal and delaying the reset signal a predetermined time period, and a presettable function presetting switch connected between the delay circuit and a key input terminal of the microcomputer.

12 Claims, 7 Drawing Figures

FUNCTION PRESETTING CIRCUIT FOR AN AUDIO/VIDEO RECORDING AND REPRODUCING SYSTEM

The present invention relates to a function presetting circuit of an audio/video recording and reproducing system which controls various functions by a microcomputer.

A stereophonic playback system for receiving a stereophonic broadcasting signal and reproducing a sound signal can reproduce sound from an FM radio signal, an AM radio signal, a magnetic tape, a disc record or a video disc. Those audio signals are selected by what is called a function switch to produce an audio output from the playback system.

In recent years, the various functions of the stereophonic playback system such as selection of audio signal inputs or volume control are controlled by a microcomputer, and the function selection by relays or analog switches is also controlled electrically by the microcomputer. In such a system, when a power supply is turned off, the content of a random access memory (RAM) is erased and the function during the power-off is not maintained. When the power supply is subsequently turned on, the microcomputer is reset. Thus, in the system which uses the microcomputer to select the functions, one predetermined function is permanently selected when the microcomputer is reset. Accordingly, if the power supply is turned on or off by a timer, the function selected at the power-on is restricted to the predetermined function and other desired functions cannot be selected. It has been proposed to provide an exclusive input port for initialization with the microcomputer. However, this increases cost because of increase of the number of ports. In a system which uses a C-MOS microcomputer to hold the function presetting, a battery is used to retain the contents of the memory during the power-off period. Such a system which utilizes the backup by the battery also increases the cost.

It is an object of the present invention to overcome the difficulties encountered in the prior art system and provide a function presetting circuit which can preset a desired function when the power supply is turned on and off by a timer, and therefore is function programmable.

In the function presetting circuit of the present invention, a function presetting program is added to an initializing program used after the reset of the microcomputer and a function presetting circuit is provided external of the microcomputer so that a desired preset function is selected at the time of power-on.

More particularly, the microcomputer is enabled by the initializing program to read in an input for a predetermined time period after the reset and then disabled to read in an input for the time following the predetermined time period. That is, the microcomputer is enabled to read in a function presetting input preset by a preset switch circuit for a predetermined time period $T_1$ in a data read-in time immediately after the reset, by a presettable function presetting switch circuit. After the execution of the function initializing program, a function selection instruction signal is preset by a mechanical switch such as a rotary switch mentioned later and is supplied to the microcomputer by a keying device of the microcomputer until the power supply is subsequently turned off. Accordingly, the preset switch circuit is enabled only for the predetermined time period after the reset to produce a function selection instruction signal.

According to the present invention, in the audio/video stereophonic playback system utilizing the microcomputer, the function presetting at the time of the power-on can be preset by the external switch so that any desired function can be selected.

Figure 2:
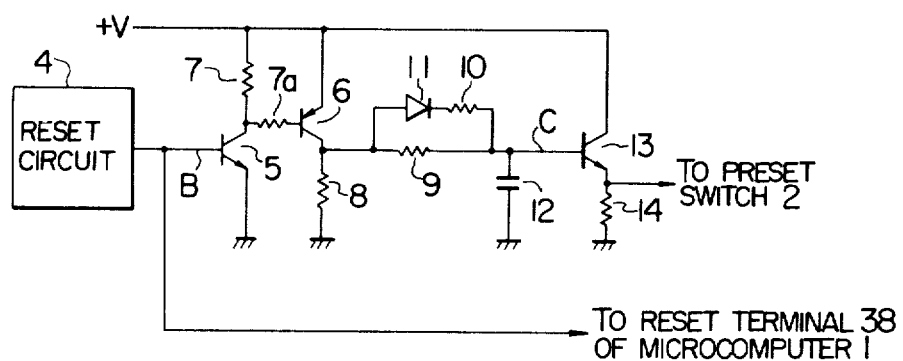
Figure 3:
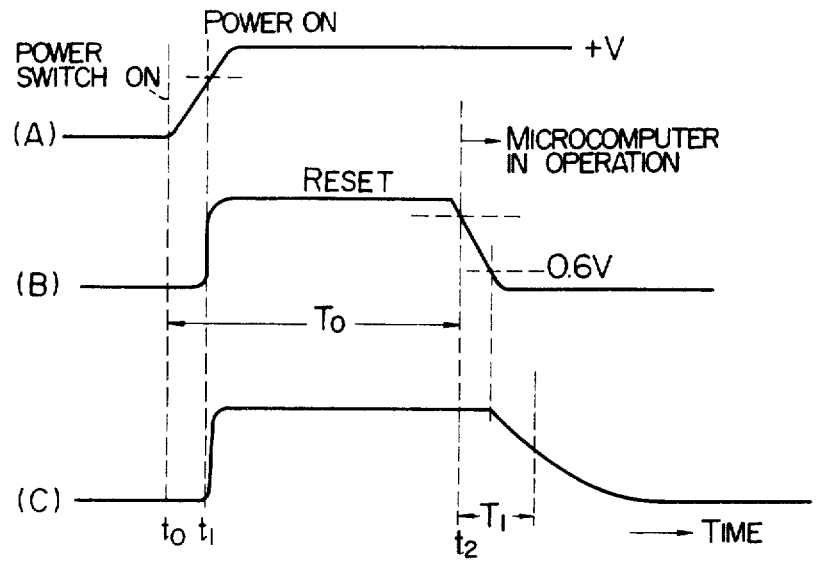
Figure 4:
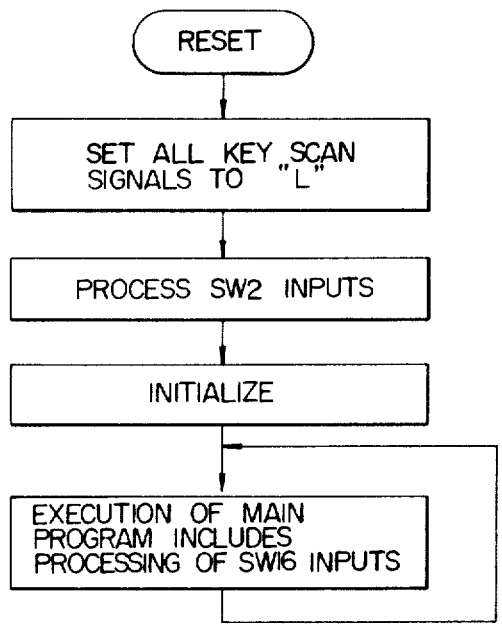
Figure 5:
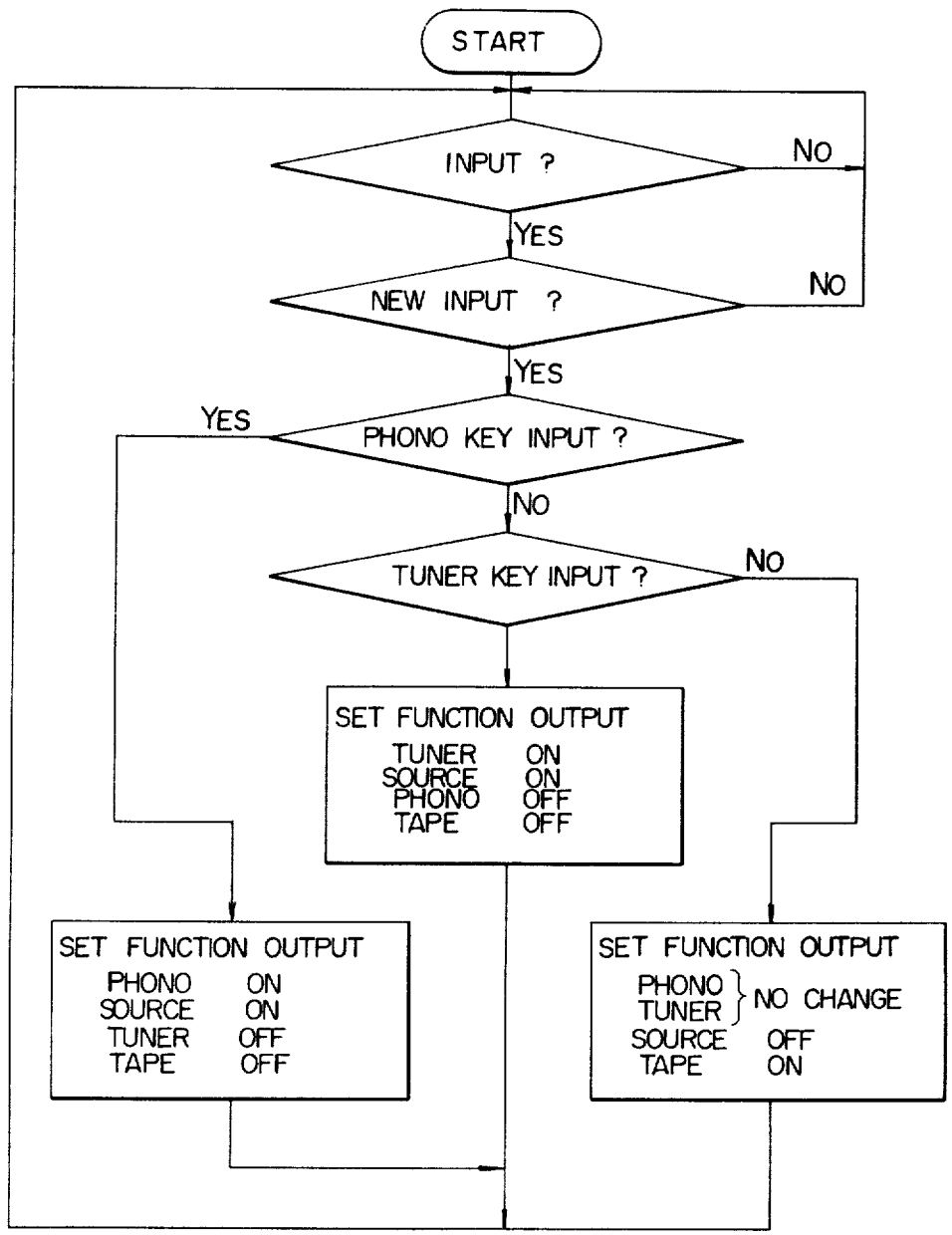
Figure 7:
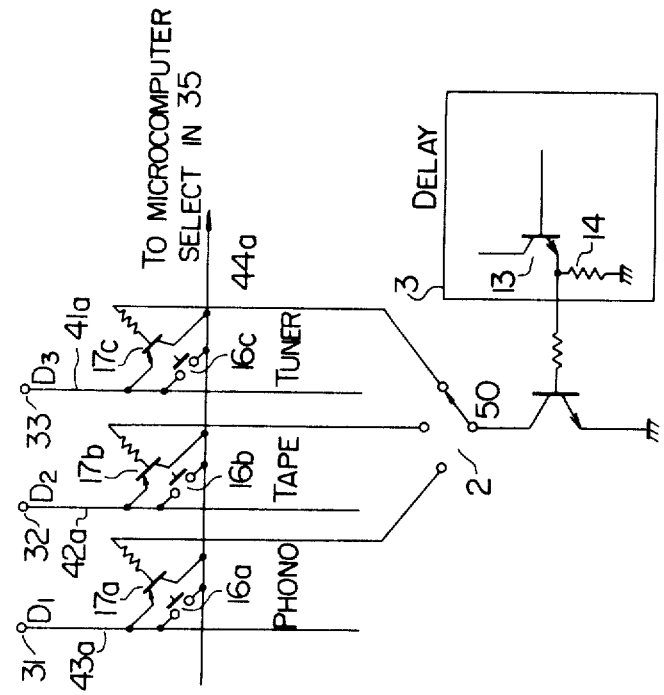
Figure 6:
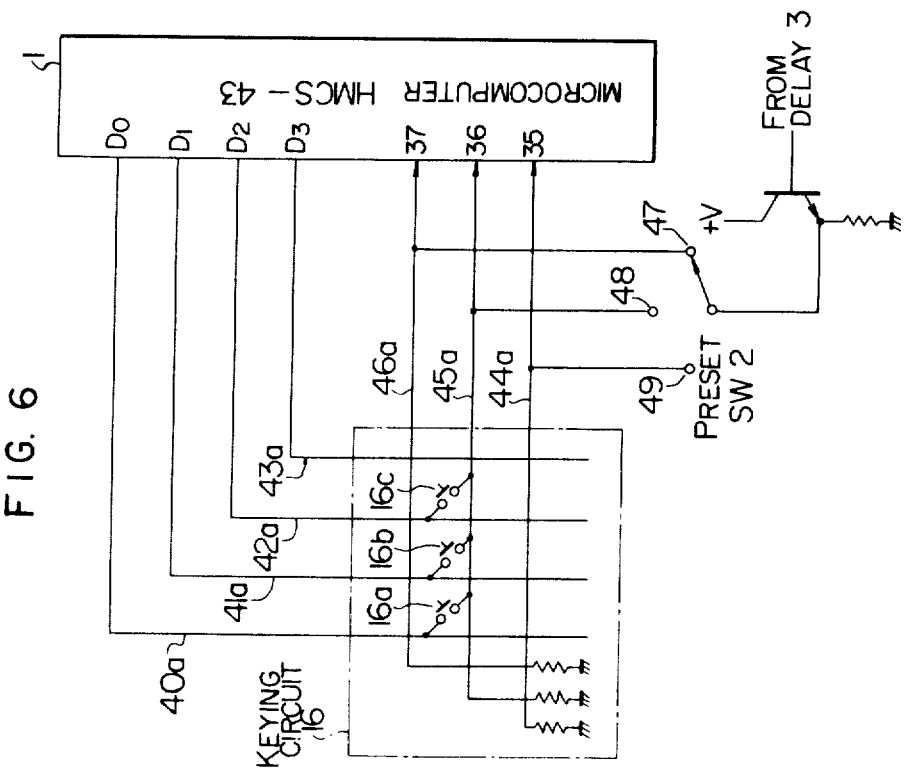

Preferred embodiments of the present invention will now be explained in detail with reference to the accompanying drawings, in which:

FIG. 1 shows a block diagram of a function presetting circuit in accordance with the present invention, FIG. 2 shows a circuit diagram of one embodiment of a delay circuit shown in FIG. 1, FIG. 3 shows voltage waveforms at various points in FIG. 2, FIG. 4 shows a flow chart of the operation of the function presetting circuit of the present invention, FIG. 5 shows a flow chart of the function presetting operation of a microcomputer, FIG. 6 shows a construction of a keying circuit shown in FIG. 1, and FIG. 7 shows a circuit diagram of another embodiment of the present invention.

FIG. 1 shows a block diagram of one embodiment of the function presetting circuit of the present invention. The function presetting circuit of the present invention generates switching control signals for a function selection circuit by a microcomputer. An overall system including the function selection circuit is disclosed in a copending application of the same assignee and the same inventors, entitled "FUNCTION SELECTING METHOD AND SYSTEM FOR AN AUDIO/VIDEO RECORDING AND REPRODUCING SYSTEM", U.S. Ser. No. 245,512 corresponding to Japanese patent application No. 55-33867, filed on Mar. 19, 1980. The present invention is applicable to the system of the above application.

In FIG. 1, numeral 1 denotes a one-chip 4-bit microcomputer having a ROM which stores predetermined programs. It may be a Hitachi Type HMCS-43 microcomputer. Numeral 2 denotes a manually operated function presetting switch, e.g., a rotary switch. Numeral 3 denotes a delay circuit, 4 denotes a reset circuit, 15 denotes a function selection circuit having relays or semiconductor switches for selecting one of signals from a plurality of signal sources in accordance with a selection instruction signal, and 16 denotes a keying circuit usually provided in a control panel of the system. Function selection control signal output terminals 26–30 of the microcomputer 1 are connected to input terminals 21–25 of the function selection circuit 15 so that the function selection circuit 15 operates in accordance with the function selection control signals supplied from the microcomputer 1 to select the specified function. Input terminals 40–43 of the keying circuit 16 are connected to scan signal output terminals 31–34 of the microcomputer 1 while output terminals 44–46 are connected to selection input terminals 35–37 of the microcomputer 1. The keying circuit 16 comprises a key matrix circuit. A desired function is specified by the keying circuit 16 except when the power supply is turned on. An input terminal 35 of the microcomputer 1 is connected to a terminal 49 of the function presetting switch 2 while a terminal 36 is connected to a terminal 48 and a terminal 37 is connected to a terminal 47 to form a 3-bit data line. Accordingly, a maximum of eight functions can be selected. An input terminal of the delay circuit 3 is connected to a output terminal of the reset circuit 4 while an output terminal of the delay circuit 3 is connected to a terminal 50 of the switch 2. An output terminal of the reset circuit 4 is connected to a reset terminal 38 of the microcomputer 1. A terminal 39 is a power supply terminal.

When the stereophonic playback system is powered and in operation, a desired function is specified from the keying device 16 and the microcomputer 1 reads in the instruction and supplies a control signal to the function selection circuit 15 to select the function. More particularly, the microcomputer 1 stores the selection (presetting) signal and transfers it to the function selection switch 15. At the time of power-on, the microcomputer 1 supplies a function control signal to the function selection circuit to select a predetermined function in accordance with a program stored in a ROM during the manufacture of the microcomputer 1 or a program in a RAM of the microcomputer 1 or an external memory which stores the inputs from the keying circuit 16. By manually setting the function presetting switch having a selectable switch function such as a mechanical manual switch holding a selected state to a desired function, the preset function other than the predetermined function can be selected. Normally, the input from the keying circuit 16 selects the function. A program is set into the microcomputer 1 such that actuation of the presetting switch 2 does not overlap with the actuation of the keying switch 16.

FIG. 2 shows a circuit diagram of the delay circuit 3, in which a base of a first switching transistor 5 is connected to an output terminal of the reset circuit 4 and a collector thereof is connected to a power supply $+V$ through a resistor 7. A base of a second switching transistor 6 is connected to the collector of the transistor 5 through a coupling resistor 7a and a collector thereof is grounded through a resistor 8 and also connected to a base of a third switching transistor 13 through a resistor 9. A collector of the transistor 13 is connected to the power supply $+V$ while an emitter thereof is grounded through a resistor 14. Connected to a cathode of a reverse current preventing diode 11 is a resistor 10 and a series circuit of the diode 11 and the resistor 10 is connected in parallel with the resistor 9. The resistance of the resistor 9 is considerably larger than that of the resistor 10. One end of a capacitor 12 is connected in series with the resistors 9 and 10 while the other end thereof is grounded to form a time constant circuit of a time constant $T_1$. An emitter of the transistor 13 is connected to a movable arm 50 of the switch 2 shown in FIG. 1 and a base of the transistor 5 is connected to a reset terminal 38 of the microcomputer 1.

In the operation of the circuit of FIG. 2, as the power supply is turned on and the voltage of the power supply reaches a predetermined magnitude, the reset circuit 4 is actuated to produce a positive reset pulse, which renders the transistor 5 conductive so that the collector potential thereof is lowered. As a result, the transistor 6 conducts. By the conduction of the transistor 6, the collector potential thereof is raised and the capacitor 12 is charged through the diode 11 and the resistor 10. As a result, the transistor 13 conducts and the emitter potential thereof rises. While the delay circuit of FIG. 2 is constructed by a charge/discharge circuit, a circuit having a monostable multivibrator function which produces a signal of a predetermined width when triggered by the reset signal may be used. Voltage waveforms at various points in FIG. 2 are shown in FIG. 3. FIG. 3 (A) shows the voltage waveform of the power supply circuit, FIG. 3 (B) shows a reset pulse signal which is applied to the base of the transistor 5 and FIG. 3 (C) shows the emitter voltage of the transistor 13. When the power supply is turned on at a time $t_0$, the voltage of the power supply gradually rises and the reset pulse becomes a high ("H") level and is supplied to the transistor 5 at a time $t_1$ and the base voltage of the transistor 5 rises as shown in FIG. 3 (B). After a time period of $T_0$ has elapsed since the power-on, that is, at a time $t_2$, the reset pulse terminates and the base voltage of the transistor 5 rapidly falls to a low ("L") level. As the reset pulse (FIG. 3 (B)) terminates, the transistors 5 and 6 are cut off and the charge stored in the capacitor 12 discharges through the resistors 8 and 9. Since the resistance of the resistor 9 is large, the charge is discharged slowly so that the base voltage of transistor 13 slowly falls as shown in FIG. 3 (C) and the transistor 13 continues to conduct. Thus, even after the reset pulse has terminated, the positive voltage is supplied to the switch 2 for a certain time period (time period $T_1$). The time period $T_1$ depends on the time constant determined by the magnitudes of the resistors 8 and 9 and the capacitor 12 and it is usually selected to an order of 100–1000 m sec. The reset pulse of the reset circuit 4 is also supplied to the microcomputer 1 to reset the microcomputer 1 at time $t_1$. Then the microcomputer becomes in operation by a trailing edge thereof (at time $t_2$). Thus, the microcomputer 1 starts to operate from its reset state at time $t_2$. After $t_2$, when the reset pulse falls to about 0.6 V, the transistor 5 is turned off, so that the emitter potential of transistor 13 gradually decreases as shown in FIG. 3 (C). The terminals 47–49 of the function presetting switch 2 are connected to the input terminals 35–37 of the microcomputer 1. In FIG. 2, the movable arm of the switch 2 is shown diagramatically. By changing the connection of the terminal 50 of the switch 2 and the terminals 47–49, a function pattern can be generated by the output voltages of the transistor 13, which pattern is applied to the microcomputer 1. Table 1 shows the function pattern.

TABLE 1

| Input Terminals | | | Outputs | |
|---|---|---|---|---|
| 35 | 36 | 37 | Function | POWER |
| L | L | L | FM1 | OFF |
| L | L | H | FM2 | ON |
| L | H | L | FM3 | ON |
| L | H | H | AM | ON |
| H | L | L | PHONO | ON |
| H | L | H | AUX | ON |
| H | H | L | TAPE1 | ON |
| H | H | H | TAPE2 | ON |

While eight functions are shown in Table 1, the number of bits of the SELECT IN terminals may be increased when more functions are needed. In Table 1, FM1, FM2 and FM 3 may be used for channel selection of the VHF band and UHF band FM radio signals. TAPE1 and TAPE2 are assigned to first and second tape decks, respectively, and AM, PHONO and AUX correspond to the functions of AM radio signal, second player and auxiliary input, respectively. More input terminals may be used to add the functions of volume up/down, unit start/stop, timer set etc.

When the terminals 47 and 50 of the switch 2 are connected and the other terminals 48 and 49 and the terminal 50 are disconnected, the emitter voltage of the transistor 13 which is approximately equal to the power supply voltage (called high level "H") is applied to the input terminal 37 of the microcomputer 1 through the switch 2. Since no voltage is applied to the other selection input terminals 35 and 36 of the microcomputer 1, the states of the terminals 35–37 are L, L, H which indicate the function FM2 as shown in Table 1. A program for operation after the reset of the microcomputer 1 is formed in accordance with a flow chart of FIG. 4 and stored in the ROM. On the other hand, the emitter voltage of the output transistor 13 of the delay circuit of FIG. 2 remains at "H" level during the time period $T_1$ even after the microcomputer 1 has started its operation so that the presetting switch 2 is kept enabled. Accordingly, in the step of processing the inputs from the switch 2 shown in FIG. 4, the microcomputer 1 reads in the inputs applied to the input terminals 35–37 through the switch 2 and a processing of the logic program of Table 1 stored in the ROM of the microcomputer 1 is carried out in accordance with the input pattern. That is, the function is initialized. A flow chart of the operation of the microcomputer 1 for the function presetting is shown in FIG. 5. In Table 1, power outputs for various indications associated with the function pattern, e.g., function indication, muting indication and power-on indication are also processed. In the program shown in FIG. 4, unless the inputs from the presetting switch 2 are all at "L" level when the microcomputer 1 has completed the execution of the initializing program and started the execution of a main program for a normal process, a malfunction may occur if the input pattern from the switch 2 is different from the input pattern from the keying circuit 16 because they can not be discriminated. In order to prevent such malfunction, the program mode according to FIG. 4 is software designed such that the input processing by the switch 2, that is, the timing of the start of the main program after completion of the function initialization occurs after a time period (delay) which is sufficiently longer than the time period $T_1$. During power on the last step in FIG. 4 is repeated without providing an output externally as shown.

FIG. 6 shows a construction of the keying circuit 16 shown in FIG. 1. The keying circuit 16 comprises a conventional scanning type key switch. Lines 40a–43a for scan signals $D_0$–$D_3$ from the scan terminals 31–34 of the microcomputer 1 and function presetting input lines 44a–46a corresponding to the functions tuner, tape deck and record player are connected in matrix through function key switches 16a–16c.

FIG. 7 shows a configuration of a keying circuit and a presetting switch circuit of the function presetting circuit in accordance with another embodiment of the present invention.

Only the selection input 35 is explained with reference to FIG. 7. Switching transistors 17a, 17b and 17c are connected in parallel with key switches 16a, 16b and 16c, respectively between the scan signal input lines 43a, 42a and 41a of the keying circuit and the selection input line 44a. The bases of the transistors are connected to stationary contacts of the presetting switch 2 through resistors. The keying circuit is not limited to the scan type.

What is claimed is:

1. A function presetting circuit for an audio/video system for at least selecting a function and controlling a selected function unit by a microcomputer having a function keying circuit, comprising;

(a) reset means for providing a reset signal to said microcomputer at a time of power-on to initialize said microcomputer, (b) a delay circuit having an output of said reset means coupled thereto in parallel with said microcomputer, said delay circuit producing a signal having a presence of a predetermined time duration in response to the reset signal from said reset means, and (c) function presetting switch means responsive to the signal from said delay circuit to produce a function selection presetting signal during the presence of said signal from said delay circuit, said presetting signal being supplied to an input terminal of said microcomputer, said microcomputer containing a stored program for allowing execution of a main program said predetermined time period after application of the reset signal and input processing by said presetting signal.

2. A function presetting circuit according to claim 1, wherein said reset means produces a square wave reset signal, said microcomputer being initialized by a trailing edge of said reset signal, and said delay circuit delays said reset signal for said predetermined time duration and provides a delayed signal to said function presetting switch means to enable said function presetting switch means.

3. A function presetting circuit according to claim 1 or 2 wherein said delay circuit includes a charge/discharge circuit having a resistor and a capacitor with a discharging time constant of said charge/discharge circuit being equal to said predetermined time duration.

4. A function presetting circuit according to claim 1 or 2 further comprising a keying circuit which produces function key output signals in synchronism with scan signals from said microcomputer and includes switching transistors in parallel with key switches for selecting scan signal lines and function key output signal lines, control terminals of said switching transistors being connected to presetting output terminals of said function presetting switch means.

5. A function presetting circuit according to claim 1 or 2 wherein said function presetting switch means includes a programmable manual switch.

6. A function presetting circuit according to claim 2 wherein said delay circuit includes a monostable multivibrator responsive to the trailing edge of the reset signal from said reset circuit for providing an enabling signal for said predetermined time duration to said function presetting switch means.

7. A function presetting circuit for an audio/video system for at least selecting a function and controlling a selected function unit by a microcomputer having a function keying circuit, comprising:

(a) reset means for automatically generating a reset signal of square pulse and providing the same to said microcomputer in response to power-on to initialize said microcomputer, (b) a delay circuit having an output of said reset means coupled thereto in parallel with said microcomputer, said delay circuit producing a signal such that a trailing edge of the square pulse of said reset signal is delayed by a predetermined time duration, and (c) function presetting switch means including a selectable mechanical switch holding a selected state and responsive to the signal from said delay circuit to produce a function selection signal corresponding to said selected state during presence of said signal produced from said delay circuit, said function selection signal being supplied to an input terminal of said microcomputer, said microcomputer containing a stored program and responsive to said function selection signal upon power-on for allowing execution of initialization of a function designated by said function selection signal and responsive to termination of said function selection signal for allowing execution of a program designated by said function keying circuit.

8. A function presetting circuit according to claim 7 wherein said presetting switch means includes a rotary switch.

9. A function presetting circuit according to claim 7 wherein said delay circuit includes a charge/discharge circuit having a resistor and a capacitor with a discharging time constant being equal to said predetermined time duration.

10. A function presetting circuit according to claim 7 wherein said function keying circuit produces function key output signals in synchronism with scan signals from said microcomputer and includes switching transistors in parallel with key switches for selecting scan signal lines and function key output signal lines, control terminals of said switching transistors being connected to presetting output terminals of said function presetting switch means.

11. A function presetting circuit according to claim 10 wherein said key switch includes at least a tuner key switch and a tape key switch.

12. A function presetting circuit according to claim 7 wherein said delay circuit includes a monostable multivibrator responsive to the trailing edge of the reset square pulse from said reset circuit for providing an enabling signal for said predetermined time duration to said function presetting switch means.

* * * * *